United States Patent [19]

Dessel

[11] Patent Number: 5,384,540
[45] Date of Patent: Jan. 24, 1995

[54] WIRE PRESENCE AND IDENTIFICATION SYSTEM

[75] Inventor: Hugo V. Dessel, Putte, Belgium

[73] Assignee: Molex Incorporated, Lisle, Ill.

[21] Appl. No.: 973,797

[22] Filed: Nov. 9, 1992

[30] Foreign Application Priority Data

Nov. 12, 1991 [EP] European Pat. Off. ............ 91119244

[51] Int. Cl.⁶ .................... G01R 19/00; G01R 31/02
[52] U.S. Cl. ...................................... 324/539; 324/66
[58] Field of Search .............. 324/539, 540, 66, 67, 324/658, 690

[56] References Cited

U.S. PATENT DOCUMENTS

| | | | |
|---|---|---|---|
| 3,528,104 | 9/1970 | Ehlschlager | 324/539 |
| 3,867,692 | 2/1975 | Esch | 324/66 |
| 4,794,339 | 12/1988 | LeNir et al. | 324/540 |
| 4,835,479 | 5/1989 | Haines | 324/540 |
| 4,916,393 | 4/1990 | Crescini et al. | 324/686 |
| 4,992,739 | 2/1991 | Kosch | 324/66 |
| 4,998,059 | 3/1991 | Nigon et al. | 324/67 |
| 5,027,074 | 6/1991 | Haferstat | 324/66 |
| 5,170,113 | 12/1992 | Albonesi | 324/66 |
| 5,280,251 | 1/1994 | Strangio | 324/66 |

FOREIGN PATENT DOCUMENTS 1019372  5/1983  U.S.S.R. .................. 324/540

Primary Examiner—Maura K. Regan
Attorney, Agent, or Firm—A. A. Tirva

[57] ABSTRACT

A system for detecting the presence of and/or identifying wires at the first end of a cable comprises a signal generator for selectively applying an electrical signal to one or more wires at the second end of the cable. At least one electrode is provided for detecting the electrical signal at the first end of the cable and electronic circuitry evaluates the signals coupled to the electrode. The signal generator is an ac generator for delivering an ac square-wave signal and the electrode comprises a conductive tube of a predetermined length for inserting a wire at the first end of the cable. The wire is electrically insulated from the electrode such that the ac signal is capacitively coupled to the electrode.

10 Claims, 2 Drawing Sheets

WIRE PRESENCE AND IDENTIFICATION SYSTEM

FIELD OF THE INVENTION

The invention relates to a system for detecting the presence of and/or identifying wires at one end of a cable the system comprising a signal generator for selectively applying an electrical signal to one or more wires at the other end of the cable, at least one electrode for detecting the electrical signal at the one end of the cable and electronic circuitry connected to at least one electrode for evaluating the signal.

BACKGROUND OF THE INVENTION

A straightforward and long used method for identifying wires of a cable provides for applying a dc or ac signal to one wire or conductor at one end of a cable and to detect the signal on the same wire at the other end of the cable. It is also known to simultaneously apply different signals, for instance signals of different polarity or frequency, to a number of wires at one end of a cable so that the wires can be identified at the other end of the cable by detecting the different signals.

When identifying the wires of a cable by means of the signals applied to the wires, it is important to establish a good contact with the wires in order to reliably detect the signals. To establish a reliable contact between one or more wires and corresponding electrodes for detecting the signals is particularly difficult if such connections are to be made by an automated assembly process, for instance in an automatic machine for connecting the wires of a cable to a connector.

Accordingly, the invention is directed to solving the problem in providing a system for detecting the presence of and/or identification of wires of a cable which allows a reliable detection and identification using an automatic or semiautomatic manufacturing process and by establishing contact with the wires to be detected and identified in a simple and reliable method.

SUMMARY OF THE INVENTION

In solution of this problem, the system includes a signal generator which is an ac generator for generating an ac signal and at least one electrode having a conductive tube of a predetermined length for inserting a wire at one end of the cable, the wire being electrically insulated from the electrode such that the ac signal is capacitively coupled to the electrode.

Because the connection between the electrode and the wire is made by a capacitive coupling between the wire and the tube walls, no metallic contact is required. Accordingly, all possible problems associated with use of metallic contacts are avoided, for instance a high or varying resistance between a conductor and its electrode. For a reliable capacitive coupling it is only necessary to introduce a wire into the conductive tube of its electrode.

Other features of the invention reside in the ac signal being a square-wave signal having a frequency between 1 kHz and 50 kHz, for instance 5 kHz. In order to avoid a direct metallic contact, in case of a wire without an insulating cover is used, a tube of insulating material, for instance a ceramic material may be inserted in the conductive tube of the electrode. The conductive tube and/or the tube of insulating material should be closed at one end. This allows for a wire to be pushed down to the bottom of the conductive and/or insulating tube. In this manner a predetermined length of the wire is automatically located in the conductive tube, and accordingly a sufficiently strong signal is coupled to the electrode.

In order to facilitate the application of the ac signal from the signal generator to selected wires of the cable a signal routing circuit may be connected between the signal generator and the wires at the other end of the cable, the routing circuit being operable to selectively connect the signal generator to one or more wires. In addition, the signal routing circuit is able to ground all wires which are not connected to the signal generator.

In order to detect an ac signal coupled from a wire to its electrode the electronic circuitry for each electrode includes a series connection of a bandpass filter for passing signals only of the frequency of the signal generator, an amplifier and a threshold circuit. The threshold circuit provides an output signal only if a wire is inserted into its corresponding electrode and is connected to the signal generator at the other end of the cable.

For an automated testing of the wires of a cable, a controller may be provided for receiving, interpreting and displaying the output signals of the threshold circuits and for generating selecting commands for the routing circuit.

A further feature of the invention is directed to a method of correctly connecting the wires of a cable to contact members of a connector including a housing having a guide and locator member and a holding member for the contact members. According to the method, first a predetermined number of wires at one end of the cable are pushed through corresponding individual holes of the guide and locator member. Thereafter the presence of the wires and their correct position in the individual holes of the guide and locator member is detected and identified by means of a system according to the invention. Finally the wires are connected to their associated contact members if the presence and correct position of the wires are verified.

For detecting the presence of a predetermined number of wires, the signal generator at the other end of the cable is connected to at least one of the wires, and it is checked whether or not an ac signal is capacitively coupled to the electrodes arranged under the holes at the correct positions of the guide and locator member. Thereafter, the individual wires of the predetermined number of wires are identified by connecting the signal generator at the other end of the cable in sequence to the wires one at a time and detecting whether or not a strong ac signal is capacitively coupled to the electrode arranged under the hole at the correct position of the guide and locator member.

BRIEF DESCRIPTION OF THE DRAWINGS

A preferred embodiment of the invention is described by referring to the drawings in which.

DETAILED DESCRIPTION OF THE PREFERRED EMBODIMENT

Figure 1:
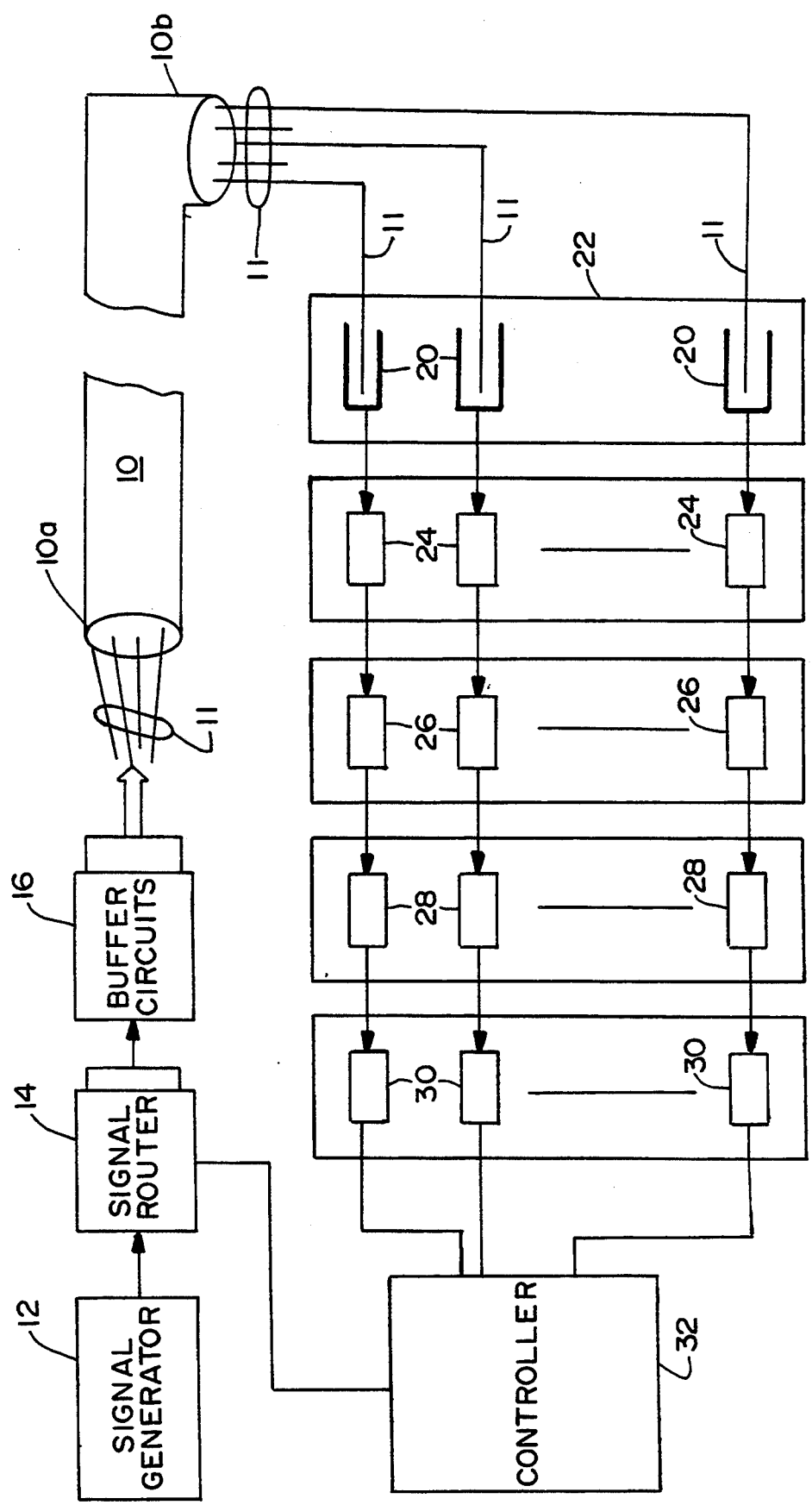
FIG. 1 is a block circuit diagram of an embodiment of the invention.

Referring to FIG. 1 there is shown a section of a cable 10 with a number of wires or conductors 11 at both ends of the cable. At one end 10a of the cable 10 a signal generator 12 applies square-wave signal with a frequency of 5 kHz and a duty cycle of 50% via a signal router circuit 14 and buffer circuits 16 to selected wires 11. Each wire 11 is connected to a separate buffer circuit which boosts the generator signal before it is injected into the wire. The signal router 14 has the capability either to inject the square-wave signal from signal generator 12 to all wires 11 of cable 10 simultaneously or to inject the signal into only selected ones or only into one wire 11. Furthermore the signal router 14 is able to ground all wires 11 into which no square-wave signals are injected.

At the other end 10b of cable 10 some of the wires 11 are inserted individually in electrodes 20 arranged in a sensor block 22. Any square-wave signal on wires 11 is capacitively coupled to electrodes 20. This will be described in more detail in discussion related to FIG. 2.

The signals coupled to electrodes 20 are applied to active bandpass filters 24 which are tuned to the frequency of signal generator 12, i.e. to 5 kHz in the present example. The square-wave signal of signal generator 12 may have any other frequency between approximately 1 kHz and 50 kHz or higher. Bandpass filters 24 however must be tuned to the respective frequency.

The output signals of bandpass filters 24 are each applied to separate amplifiers 26 for amplification of the signals. Amplifiers 26 are followed by individual threshold detectors 28. The output signal of threshold detectors 28 is a logic signal which is at a first logic state so long as the input signal of the respective threshold detector 28 is below a predetermined threshold level and switches to a second logic state if the input signal of the threshold detector is above the predetermined threshold level. The predetermined thresholds and the gain of amplifiers 26 are selected in such a manner that the output of each threshold detector 28 is at the first logic state if no signal is coupled to the respective electrode 20, i.e., if no wire 11 is inserted into the electrode 20 or if an inserted wire does not have a sufficiently strong signal on it. If on the other hand a wire couples a sufficiently strong signal to its electrode 20 the output of the respective threshold detector switches to its second logic state.

The outputs of threshold detectors 28 are applied to opto-couples 30 which provide for an electrical separation between amplifiers 28 and a controller 32. Controller 32 interprets the output signals of opto-couplers 30 and also generates the commands for controlling signal router 14. Controller 32 includes a program controlled microprocessor (not shown).

Figure 2:
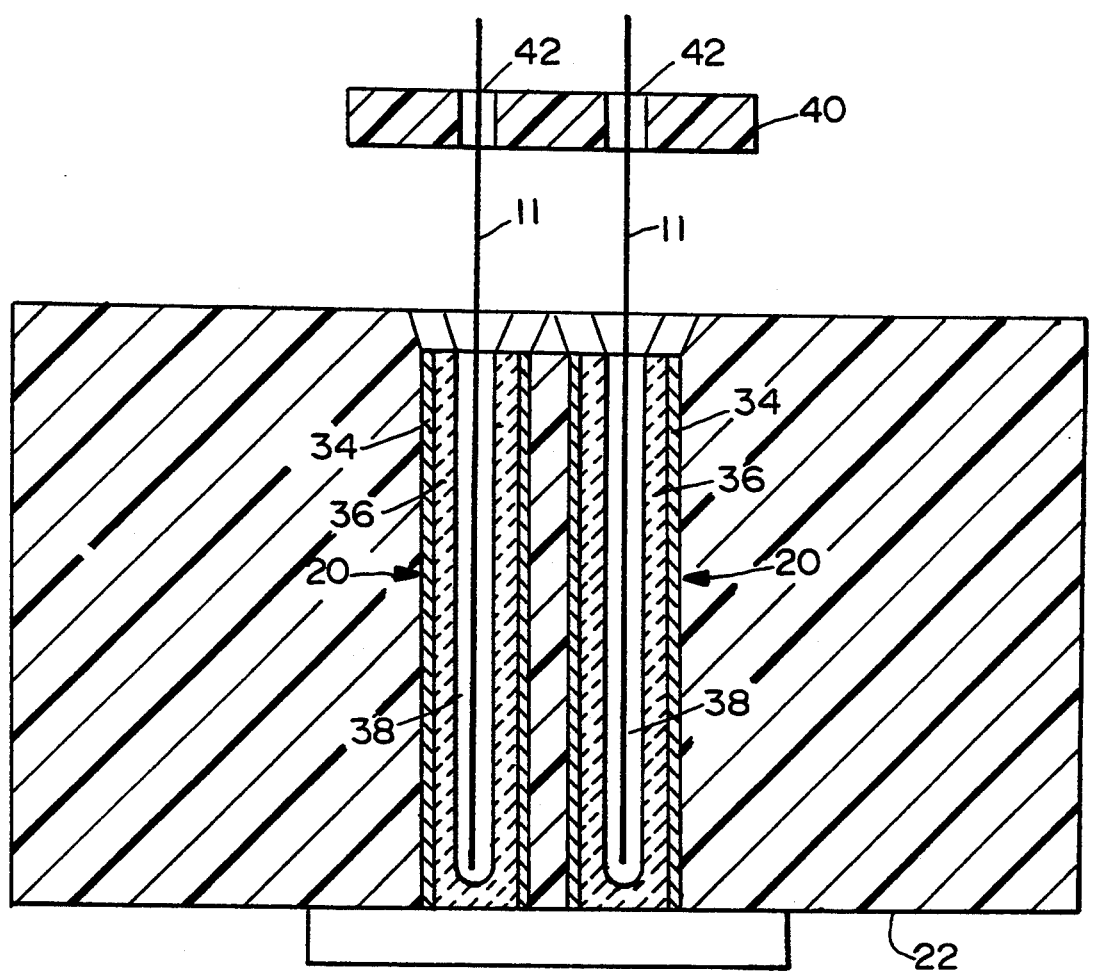
FIG. 2 is a cross-sectional view of the electrodes used in the embodiment of the invention according to FIG. 1.

FIG. 2 shows in greater detail electrodes 20 which are inserted in a sensor block 22. The block forms part of a larger system (not shown) for connecting wires of a cable to a connector. Electrodes 20 each include a metal tube 34, for instance a tube made of brass or copper. Inserted in tube 34 is a ceramic tube 36 which is closed at the bottom so that a cavity 38 is formed which is electrically insulated from tube 34. Wires 11 of cable 10, shown in FIG. 1, may be inserted into the cavity 38. When the end of a wire touches the bottom of ceramic tube 36 a predetermined length of wire 11 couples capacitively with tube 34 of electrode 20. In view of the defined length of wire 11 introduced into electrode 20 the capacity between a wire 11 and tube 34 is substantially constant so that substantially constant strength ac signal is coupled to electrode 20 if a wire is fully inserted.

Above block 22 there is shown schematically a wire guide and locator member 40 which forms an upper housing half of a connector (not shown) the lower housing half of which holds the contacts (not shown) to which wires 11 are to be connected.

The sequence of operations will now be described by referring to FIG. 1. All wires 11 at one end 10a of the cable 10 are connected to their respective buffer circuits in block 16. At the other end 10b of cable 10 three wires 11 are inserted in corresponding electrodes 20. There is no limitation for the number of electrodes so that there may be more or less than three electrodes for a respective number of wires 11.

Initially controller 32 directs signal router 14 to apply a 5 kHz square-wave signal via buffer circuits 16 to all wires 11 of cable 10. If a wire 11 is correctly inserted into each electrode 20 an ac square-wave signal will be coupled capacitively to electrode 20 which signal is strong enough to switch the output of threshold detector 30 to its second logic state. In this manner controller 32 detects the presence of wires 11 in electrodes 20.

Upon detecting the presence of one or more wires, three in the present case, controller 32 directs a signal router 14 to apply the ac square-wave signal to only one wire 11 and to ground all other wires. Accordingly only one wire 11 carries a signal strong enough to switch the output of the appropriate threshold detector 30 associated with electrode 20 into which the respective wire is inserted. In this manner the respective wire can be positively identified by controller 32. The other wires 11 inserted in electrodes 20 will be similarly identified applying the ac square-wave signal to the respective wires at end 10a of cable 10.

While a grounding of all wires except the one to which the ac square-wave signal is applied will short circuit or at least reduce signals due to a cross-talk between the wires, such grounding may not be necessary in case the difference in signal strength is sufficient for the wire to which the ac square-wave signal is applied to trigger its threshold detector without affecting the detectors of all the other wires.

When connecting wires to the contacts of a connector by means of a system of the present invention, two wires 11 are pushed through openings 42 of guide and locator member 40 as shown in FIG. 2. The two wires are fully inserted into cavities 38 of electrodes 20 and the presence of each of the two wires 11 therein is detected by means of the circuit arrangement according to FIG. 1. Thereafter, the specific position of each of the wires 11 in holes 42 of guide and locator member 40 is identified by applying a signal alternately to only one of wires 11. If the wire positions are correct the two wires can be pulled down and the next two wires may be positioned and checked in the next positions of member 40. When all wires have been inserted the machine will cut all wires and connect them to the respective contacts.

I claim:

1. A system for detecting the presence of and/or identifying wires at first end of a cable, the system comprising a signal generator for selectively applying an electrical signal to one or more wires at the second end of the cable, at least one electrode for detecting the electrical signal at the first end of the cable and electronic circuitry connected to at least one electrode for evaluating the signal, wherein the signal generator is an ac generator for delivering an ac signal and at least one electrode comprises a conductive tube of a predetermined length for inserting a wire at the first end of the cable, the wire being electrically insulated from the electrode, the ac signal being capacitively coupled to the electrode.

2. A system according to claim 1, wherein the ac signal is a square-wave signal having a frequency between 1 kHz and 50 kHz.

3. A system according to claim 1 or 2, wherein a tube of insulating material is inserted into the conductive tube of the electrode.

4. A system according to claim 3, wherein the tube of insulating material is a ceramic tube.

5. A system according to claim 4, wherein the conductive tube of the electrode and/or the tube of insulating material are closed at one end.

6. A system according to claim 1, wherein a signal routing circuit it connected between the signal generator and the wires at the second end of the cable, the routing circuit being operable to selectively connect the signal generator to one or more wires.

7. A system according to claim 6, wherein the signal routing circuit grounds all wires which are not connected to the signal generator.

8. A system according to claim 1, wherein the electronic circuitry comprises for each electrode a series connection of a bandpass filter for passing only signals having the frequency of the signal generator, an amplifier and a threshold circuit providing an output signal only in case that a wire is inserted into its corresponding electrode and is connected to the signal generator at the second end of the cable.

9. A system according to claim 8, wherein the circuitry includes a controller for receiving, interpreting and displaying the output signals of the threshold circuits and for generating selecting commands for the signal routing circuit.

10. A method for connecting the wires of a cable to contact members of a connector comprising a housing including a guide and locator member and a holding member for the contact members, the method comprising the steps:

a) pushing a predetermined number of wires at first end of the cable through corresponding individual holes of the guide and locator member, b) detecting the presence of the wires and identifying their correct position in the individual holes of the guide and locator member by means of a system comprising a signal generator for selectively applying an electrical signal to one or more wires at the second end of the cable, at least one electrode for detecting the electrical signal at the first end of the cable and electronic circuitry connected to at least one electrode for evaluating the signal, wherein step b) comprises the following steps:

i. detecting the presence of the predetermined number of wires by connecting the signal generator at the second end of the cable to at least one of the wires and checking whether or not an ac signal is capacitively coupled to the electrodes arranged under the holes at the correct positions of the guide and locator member, ii. identifying the individual wires of the predetermined number of wires by connecting the signal generator at the second end of the cable in sequence to the wires one at a time and detecting whether or not a strong ac signal is capacitively coupled to the electrode arranged under the hole at the correct position of the guide and locator member, c) connecting the wires to their associated contact members, if in step b) the presence and correct positions were verified.

* * * * *